United States Patent
Coushaine et al.

(10) Patent No.: US 7,059,748 B2
(45) Date of Patent: *Jun. 13, 2006

(54) LED BULB

(75) Inventors: Charles M. Coushaine, Rindge, NH (US); Kim Albright, Warner, NH (US); Thomas Tessnow, Weare, NH (US); Vipin Madhani, Burlington, MA (US)

(73) Assignee: OSRAM Sylvania Inc., Danvers, MA (US)

( * ) Notice: Subject to any disclaimer, the term of this patent is extended or adjusted under 35 U.S.C. 154(b) by 154 days.

This patent is subject to a terminal disclaimer.

(21) Appl. No.: 10/838,090

(22) Filed: May 3, 2004

(65) Prior Publication Data

US 2005/0243559 A1    Nov. 3, 2005

(51) Int. Cl.
*F21V 29/00* (2006.01)

(52) U.S. Cl. .................. 362/294; 362/547; 362/373
(58) Field of Classification Search ............... 362/294, 362/547, 548, 545, 540, 541, 499, 264, 345, 362/373, 800, 542, 498, 227, 240
See application file for complete search history.

(56) References Cited

U.S. PATENT DOCUMENTS

| 5,857,767 | A * | 1/1999 | Hochstein | 362/294 |
| 6,773,138 | B1 * | 8/2004 | Coushaine | 362/656 |
| 6,955,451 | B1 * | 10/2005 | Coushaine et al. | 362/294 |
| 2004/0201993 | A1 * | 10/2004 | Coushaine et al. | 362/294 |
| 2005/0024870 | A1 * | 2/2005 | Coushaine | 362/249 |
| 2005/0067942 | A1 * | 3/2005 | Coushaine | 313/498 |

* cited by examiner

*Primary Examiner*—Ali Alavi
*Assistant Examiner*—Bao Q Truong
(74) *Attorney, Agent, or Firm*—William E. Meyer

(57) ABSTRACT

An LED light source (10) has a housing (12) with a base (14). A central heat conductor (18) is centrally located within the hollow core (16) and is formed of a suitable heat-conducting material, such as copper. A cap (36) is fitted over a second printed circuit board (24), and a heat sink (38) is attached to the base (14) and in thermal contact with a first printed circuit board (20). The heat sink (38) has a bottom (40) with an upstanding side wall (42) terminating in a plurality of fingers (44), the fingers (44) being formed to overlie an upper surface (46) of the base (14). The heat sink (38) is preferably formed from black-anodized aluminum.

6 Claims, 4 Drawing Sheets

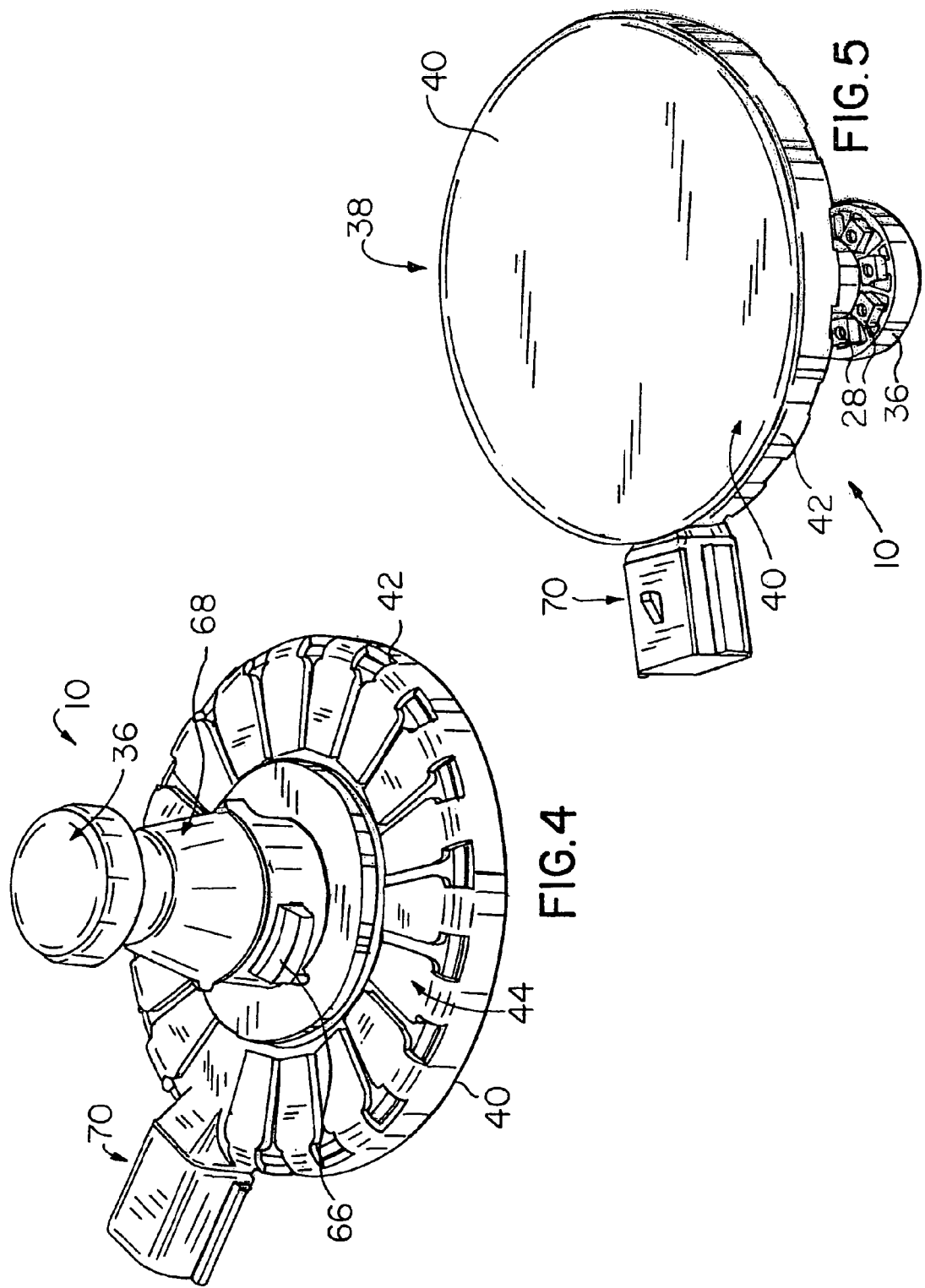

_US 7,059,748 B2_

LED BULB

TECHNICAL FIELD

This invention relates to light sources and more particularly to light sources employing light emitting diodes (LED or LEDs) and more particularly to light sources useful in the automotive field such as for headlights, taillights, stoplights, fog lights, turn signals, etc. Still more particularly, it relates to such light sources packaged to achieve industry accepted interchangeability.

BACKGROUND ART

In the past, most automotive light sources have involved the use of incandescent bulbs. While working well and being inexpensive, these bulbs have a relatively short life and, of course, the thin filament employed was always subject to breakage due to vibration.

Recently some of the uses, particularly the stoplight, have been replaced by LEDs. These solid-state light sources have incredible life times, in the area of 100,000 hours, and are not as subject to vibration failures. However, these LED sources have been hard-wired into their appropriate location, which increase the cost of installation. It would, therefore, be an advance in the art if an LED light source could be provided that had the ease of installation of the incandescent light sources. It would be a still further advance in the art if an LED light source could be provided that achieved an industry accepted interchangeable standard to replace the aforementioned incandescent bulb.

DISCLOSURE OF INVENTION

It is, therefore, an object of the invention to obviate the disadvantages of the prior art.

It is another object of the invention to enhance LED light sources.

Yet another object of the invention is the provision of a replaceable LED light source.

These objects are accomplished, in one aspect of the invention, by an LED light source that comprises a housing having a base with a hollow core projecting therefrom. The core is substantially conical. A central heat conductor is centrally located within the hollow core, and has a first printed circuit board connected to one end and a second printed circuit board fitted to a second end. The second printed circuit board has at least one LED operatively fixed thereto. A plurality of electrical conductors has proximal ends attached to and extending from the second printed circuit board and distal ends attached to the first printed circuit board. A cap is fitted over the second printed circuit board and a heat sink is attached to the base and in thermal contact with the first printed circuit board. The heat sink has a bottom with an upstanding sidewall terminating in a plurality of fingers and the fingers are formed to overlie an upper surface of the base.

This LED light source is completely self-contained and is capable of assembly to an existing reflector. The necessary electrical connection is supplied by a standard plug and socket arrangement, such as has been used for many years in the automotive field, thus eliminating the need for hard-wiring and custom circuitry.

BRIEF DESCRIPTION OF THE DRAWINGS

FIG. 4 is a top perspective view of an embodiment of the invention; and

FIG. 5 is a bottom perspective view of an embodiment of the invention.

BEST MODE FOR CARRYING OUT THE INVENTION

For a better understanding of the present invention, together with other and further objects, advantages and capabilities thereof, reference is made to the following disclosure and appended claims taken in conjunction with the above-described drawings.

Figure 1:
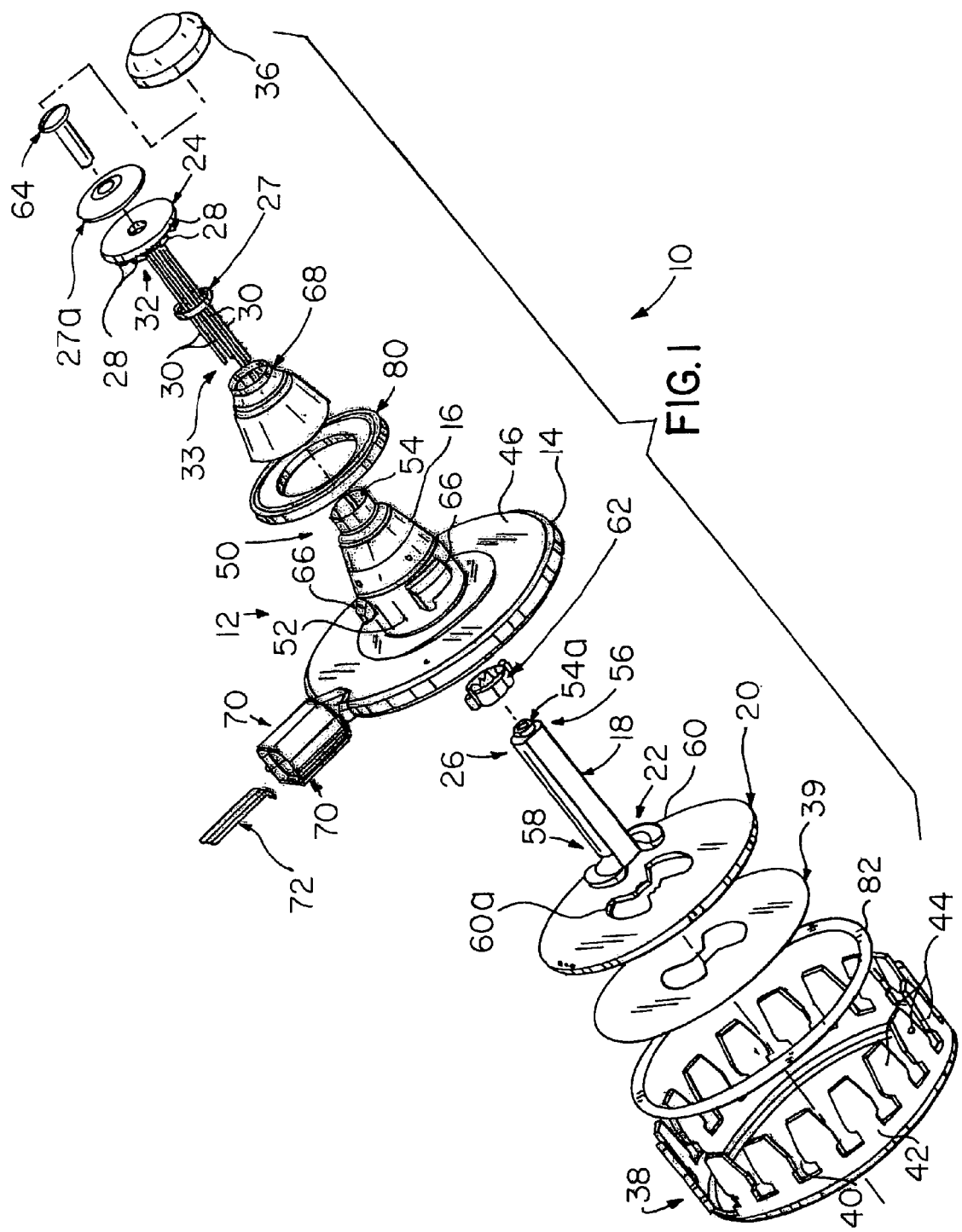
FIG. 1 is an exploded, perspective view of an embodiment of the invention

Referring now to the drawings with greater particularity, there is shown in FIG. 1 LED light source 10 comprising a housing 12 having a base 14. A hollow core 16 projects from the base, the core being substantially conical. A central heat conductor 18 is centrally located within the hollow core 16 and is formed of a suitable heat-conducting material, such as copper. Preferably, the central heat conductor 18 is press-fitted into the core. A first printed circuit board 20 is positioned in the base 14 and a second printed circuit board 24 is fitted to a second end 26 of the central heat conductor 18. The printed circuit board 20 is spaced from the post 18 so that the heat generated at printed circuit board 24 is conducted through post 18 directly to the a hat sink 42. A silicone gasket seal 27 is applied to the end 22 before the second printed circuit board is installed and a copper washer 27a is positioned over the second printed circuit board. The second printed circuit board has at least one LED 28 operatively fixed thereto. In a preferred embodiment of the invention eight LEDs 28 are fixed about the periphery of the printed circuit board 24. If the LED light source 10 is to be employed as a taillight, then all of the LEDs can be red light emitters. Alternatively, other, different color light emitting diodes can be used, depending upon the effect desired.

Four electrical conductors 30 are provided having proximal ends 32 attached to and extending from the second printed circuit board 24 and distal ends 32 attached to the first printed circuit board 20. A cap 36 is fitted over the second printed circuit board 24, and a heat sink 38 is attached to the base 14 and in thermal contact with the first printed circuit board 20. The heat sink 38 has a bottom 40 with an upstanding side wall 42 terminating in a plurality of fingers 44, the fingers 44 being formed to overlie an upper surface 46 of the base 14. The heat sink 38 is preferably formed from blackened-anodized aluminum for heat radiation purposes.

The thermal contact between the heat sink 38 and the first printed circuit board 20 is achieved by means of thermal putty 39, such as Thermagon 304.

Since the entire LED light source 10 is substantially symmetrically arrayed about an axis, it is extremely helpful to the assembly operation if all of the parts arrayed along the axis are keyed to provide the proper orientation.

In this regard, the LED light source 10 has the hollow core 16 formed with first and second ends 50, 52, respectively, and the first end 50 is provided with a keyway 54 and the central heat conductor 18 has first and second ends 56, 58, respectively, and the first end 56 has a matching core key 54*a*. This mating keyway and key, which can comprise a flattened wall on the central heat conductor and a mating flat wall in the central core, insure that the central heat conductor 18 is properly positioned with respect to the hollow core 16.

Likewise, the second end 58 of the central heat conductor 18 is provided with a key 60 and the first printed circuit board 20 has a matching keyway 60*a*. In the specific embodiment shown the keyway 60 takes the form of a double fan-shaped opening and the key 60*a* conforms thereto. Obviously, other forms of keyway and key can be employed although the double fan shape is preferred for its heat distribution properties to the heat link 42.

Figure 2:
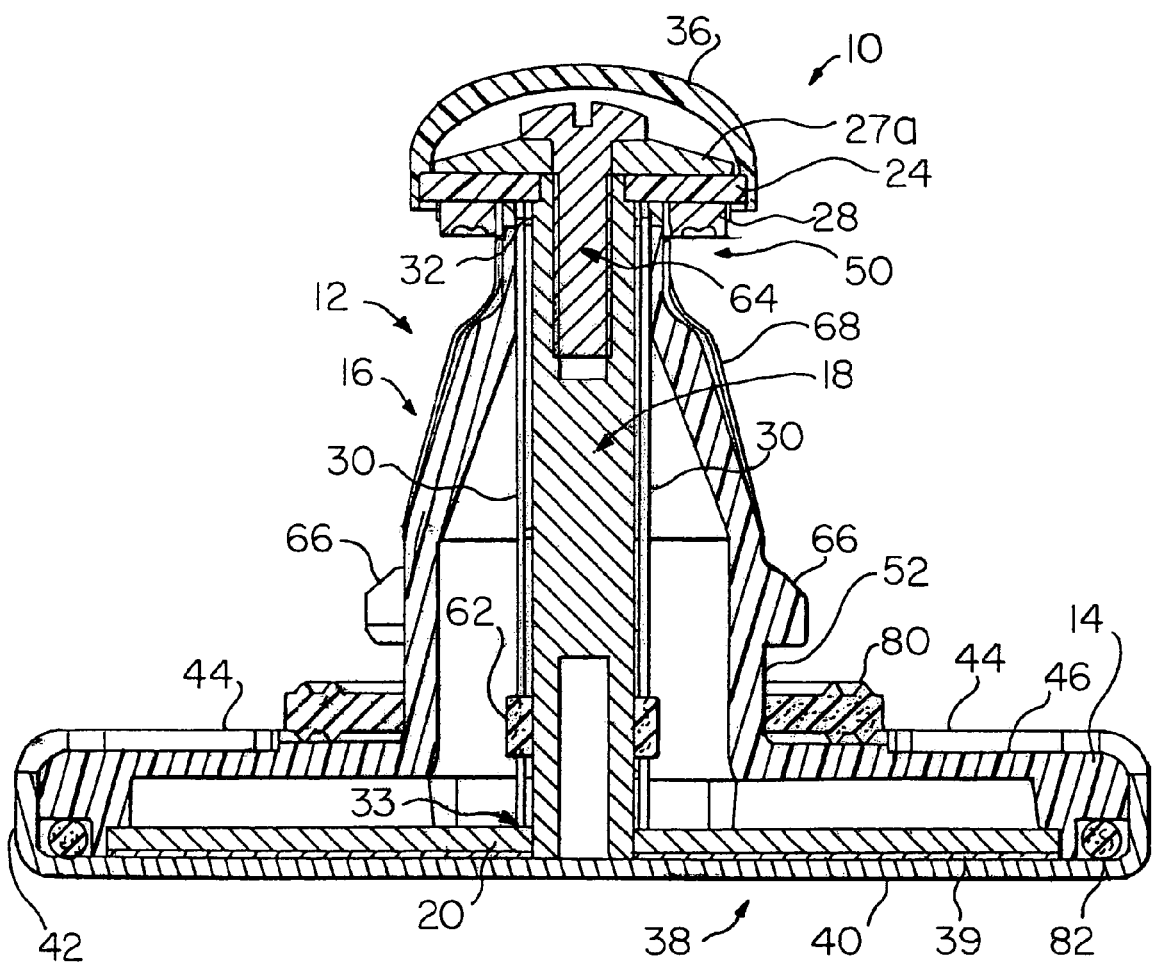
FIG. 2 is an elevational, sectional view of an embodiment of the invention.
Figure 3:
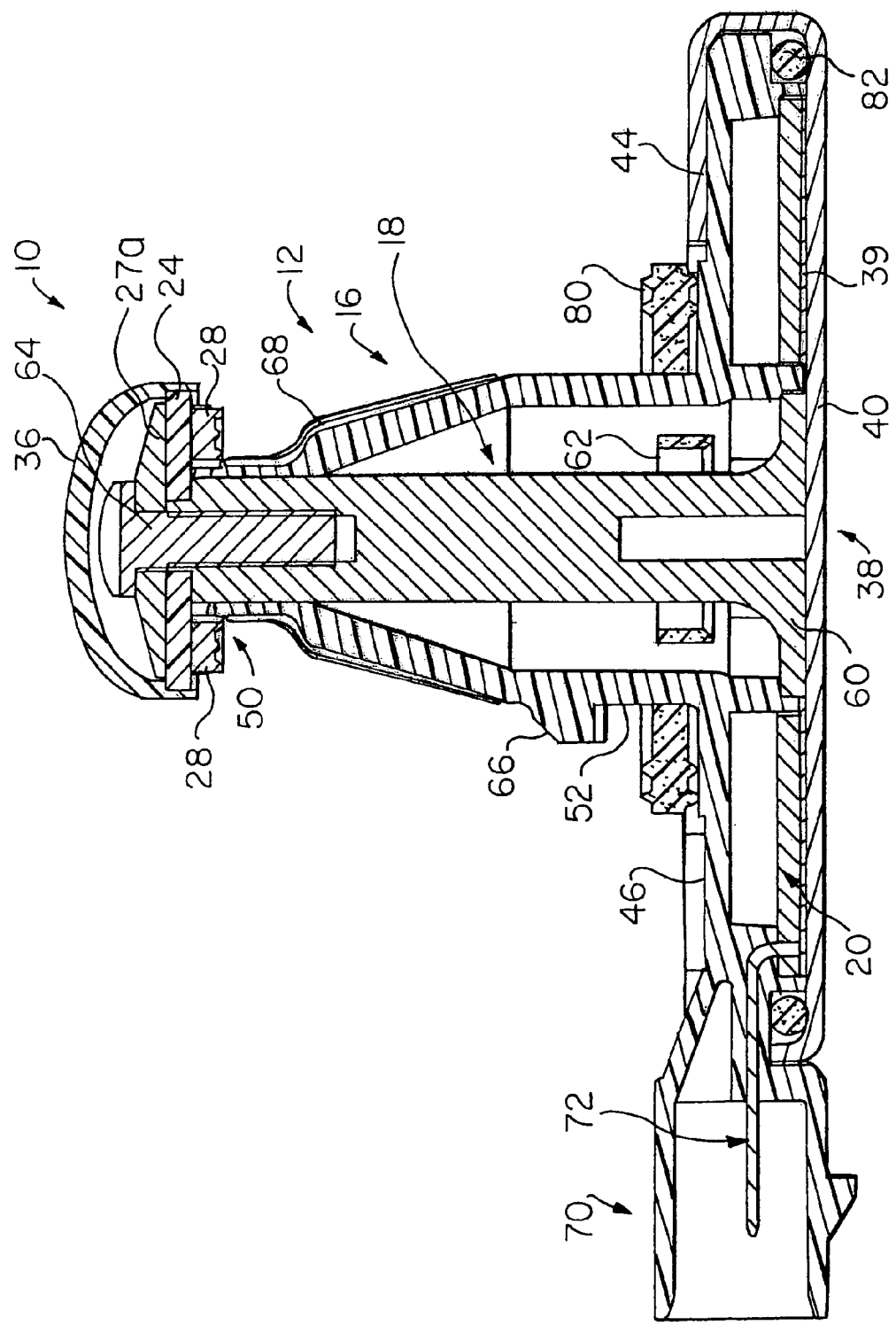
FIG. 3 is a similar elevational sectional view of an embodiment of the invention, rotated 90° from that of FIG. 2.

For maintaining alignment between the electrical conductors 30 the central heat conductor 18 has an electrical conductor aligner 62 positioned thereabout, between the first printed circuit board 20 and the second printed circuit board 24. The aligner 62 is best seen in FIGS. 2 and 3 and maintains the proper positioning of the four electrical conductors 30.

In a preferred embodiment of the invention the second printed circuit board 24 is fixed to the central heat conductor 18 by a thread-forming screw 64. If desired a second thread-forming screw could be used to fix the first printed circuit board 20 to the central heat conductor. If desired copper plugs that are press fits into the conductor 18 could also be employed. In an alternate embodiment the cap 36 can be metallized and the cap 36, the washer 27*a* and the screw 64 can be combined into a single part to reduce the number o parts and to achieve better thermal contact with the post 18.

The use of thread-forming screws enhances the thermal contact to the copper post and eliminates a secondary machining operation.

The hollow core 16 is provided at its lower end, that is, the end closest to the base 14, with a plurality of flanges 66 for engaging a suitable opening in a reflector and at its upper end with a metallized optic 68. The metallized optic 68 can be a separate metal construct that is fitted over the hollow core 16 or it can be a metal layer plated directly on the plastic core.

External electrical connection to the LEDs is provided through plug 70, which contains three molded-in electrical contacts 72. Therefore, only seven solder points are required for the connection to the first printed circuit board 20, the three connections for the molded-in contacts 72 and the four connections for the electrical conductors 30. A reflector gasket 80 is positioned about the core 16 and an O-ring 82 is positioned in the base 14, to provide an environmental seal.

Thus, there is provided an LED light source that is self-contained and easily installable and replaceable, should the need arise.

While there have been shown and described what are at present considered to be the preferred embodiments of the invention, it will be apparent to those skilled in the art that various changes and modification can be made herein without departing from the scope of the invention as defined by the appended claims.

What is claimed is:

1. An LED light source comprising:
a housing having a base;
a hollow core projecting from said base, said core being substantially conical;
a central heat conductor centrally located within said hollow core;
a first printed circuit board connected to one end of said central heat conductor;
a second printed circuit board fitted to a second end of said central heat conductor, said second printed circuit board having at least one LED operatively fixed thereto;
a plurality of electrical conductors having proximal ends attached to and extending from said second printed circuit board and distal ends attached to said first printed circuit board;
a cap fitted over said second printed circuit board; and
a heat sink attached to said base and in thermal contact with said first printed circuit board, said heat sink having a bottom with an upstanding side wall terminating in a plurality of fingers, said fingers being formed to overlie an upper surface of said base.

2. An LED light source comprising:
a housing having a base;
a hollow core Projecting from said base, said core being substantially conical;
a central heat conductor centrally located within said hollow core;
a first printed circuit board connected to one end of said central heat conductor;
a second printed circuit board fitted to a second end of said central heat conductor, said second printed circuit board having at least one LED operatively fixed thereto;
a plurality of electrical conductors having proximal ends attached to and extending from said second printed circuit board and distal ends attached to said first printed circuit board;
a cap fitted over said second printed circuit board; and
a heat sink attached to said base and in thermal contact with said first printed circuit board, said heat sink having a bottom with an upstanding side wall terminating in a plurality of fingers, said fingers being formed to overlie an upper surface of said base,
wherein said thermal contact between said heat sink and said first printed circuit board is achieved by means of a thermal putty.

3. An LED light source comprising:
a housing having a base;
a hollow core projecting from said base, said core being substantially conical;
a central heat conductor centrally located within said hollow core;
a first printed circuit board connected to one end of said central heat conductor;
a second printed circuit board fitted to a second end of said central heat conductor, said second printed circuit board having at least one LED operatively fixed thereto;
a plurality of electrical conductors having proximal ends attached to and extending from said second printed circuit board and distal ends attached to said first printed circuit board;
a cap fitted over said second printed circuit board; and
a heat sink attached to said base and in thermal contact with said first printed circuit board, said heat sink having a bottom with an upstanding side wall terminating in a plurality of fingers, said fingers being formed to overlie an upper surface of said base,
wherein said hollow core has first and second ends and said first end is provided with a keyway and said central heat conductor has first and second ends and said first end has a matching core key.

4. The LED light source of claim 3 wherein said second end of said central heat conductor is provided with a second core key and said first printed circuit board has a matching keyway.

5. The LED light source of claim 4 wherein said central heat conductor has an electrical conductor aligner positioned thereabout between said first printed circuit board and said second printed circuit board for maintaining alignment between said electrical conductors.

6. The LED source of claim 1 wherein said second printed circuit board is fixed to said central heat conductor by a thread-forming screw.

* * * * *